(12) United States Patent
Lee

(10) Patent No.: US 9,502,484 B2
(45) Date of Patent: Nov. 22, 2016

(54) THIN-FILM TRANSISTOR SUBSTRATE, RELATED LIGHT-EMITTING APPARATUS, AND RELATED MANUFACTURING METHOD

(71) Applicant: Samsung Display Co., Ltd., Yongin, Gyeonggi-Do (KR)

(72) Inventor: Dong-Won Lee, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/161,243

(22) Filed: Jan. 22, 2014

(65) Prior Publication Data

US 2015/0001492 A1    Jan. 1, 2015

(30) Foreign Application Priority Data

Jun. 26, 2013 (KR) ................... 10-2013-0073963

(51) Int. Cl.
| | |
|---|---|
| *H01L 27/32* | (2006.01) |
| *H01L 27/12* | (2006.01) |
| *H01L 51/56* | (2006.01) |
| *H01L 29/786* | (2006.01) |

(52) U.S. Cl.
CPC ....... *H01L 27/3258* (2013.01); *H01L 27/1248* (2013.01); *H01L 29/78636* (2013.01); *H01L 27/1266* (2013.01)

(58) Field of Classification Search
CPC ............ H01L 51/56; H01L 27/3258; H01L 27/326; H01L 27/1248; H01L 27/1266

USPC .............................. 257/40, 66; 438/666, 23
See application file for complete search history.

(56) References Cited

U.S. PATENT DOCUMENTS

| | | | |
|---|---|---|---|
| 6,034,747 A * | 3/2000 | Tanaka et al. ................ 349/43 |
| 8,487,310 B2 | 7/2013 | Kang et al. | |
| 2002/0001886 A1 * | 1/2002 | Ohtani ................ G02B 27/017 |
| | | | 438/151 |
| 2002/0104995 A1 * | 8/2002 | Yamazaki et al. .............. 257/72 |
| 2005/0218794 A1 * | 10/2005 | Seo ..................... H01L 51/5271 |
| | | | 313/504 |
| 2006/0290828 A1 * | 12/2006 | Hwang et al. .................. 349/43 |
| 2008/0001937 A1 * | 1/2008 | Shin .................. G02F 1/136227 |
| | | | 345/204 |
| 2008/0012008 A1 * | 1/2008 | Song et al. ..................... 257/40 |
| 2009/0194780 A1 * | 8/2009 | Kwon ............................ 257/98 |

(Continued)

FOREIGN PATENT DOCUMENTS

| | | |
|---|---|---|
| KR | 10-2006-0041112 | 5/2006 |
| KR | 10-2012-0000402 | 1/2012 |
| KR | 10-2012-0043438 | 5/2012 |

*Primary Examiner* — Moazzam Hossain
(74) *Attorney, Agent, or Firm* — Innovation Counsel LLP

(57) ABSTRACT

A thin-film transistor substrate may include an electrical wiring structure that includes a first electrode, which may be a source electrode, a drain electrode, or a capacitor electrode. The thin-film transistor substrate may further include a first insulating layer that directly contacts a first side of the first electrode. The thin-film transistor substrate may further include a second insulating layer that directly contacts a second side of the first electrode opposite the first side of the first electrode. The thin-film transistor substrate may further include a first filling layer that is disposed between the first insulating layer and the second insulating layer.

13 Claims, 6 Drawing Sheets

(56) References Cited

U.S. PATENT DOCUMENTS

2011/0199564 A1\* 8/2011 Moriwaki ......... G02F 1/136227
   349/122
2011/0215336 A1\* 9/2011 Onodera et al. ................ 257/71

\* cited by examiner

THIN-FILM TRANSISTOR SUBSTRATE, RELATED LIGHT-EMITTING APPARATUS, AND RELATED MANUFACTURING METHOD

RELATED APPLICATIONS

This application claims the benefit of Korean Patent Application No. 10-2013-0073963, filed on Jun. 26, 2013, in the Korean Intellectual Property Office, the disclosure of which is incorporated herein in its entirety by reference.

BACKGROUND

1. Field

The present invention is related to a thin-film transistor (TFT) substrate, a light-emitting apparatus that includes the TFT substrate, a method for manufacturing the TFT substrate, and a method for manufacturing the light-emitting apparatus.

2. Description of the Related Art

A light-emitting apparatus, such as an organic light-emitting display apparatus, may include an organic light-emitting diode in a display region. The organic light-emitting diode may include a pixel electrode, an opposite electrode that overlaps the pixel electrode, and an intermediate layer that is disposed between the pixel electrode and the opposite electrode and includes an emission layer (EML).

If the intermediate layer or the EML has a substantially non-uniform thickness, the luminance of the organic light-emitting diode may be substantially non-uniform. As a result, the image display quality of the organic light-emitting display apparatus may be unsatisfactory.

SUMMARY

One or more embodiments of the present invention may be related to a thin-film transistor (TFT) substrate. The TFT substrate may include an electrical wiring structure that includes a first electrode. The first electrode may be a source electrode, a drain electrode, or a capacitor electrode. The TFT substrate may further include a first insulating layer that directly contacts a first side of the first electrode. The TFT substrate may further include a second insulating layer that directly contacts a second side of the first electrode opposite the first side of the first electrode. The TFT substrate may further include a first filling layer that is disposed between the first insulating layer and the second insulating layer.

The first filling layer is formed of a first material. The second insulating layer may be formed of a second material that is different from the first material. The first insulating layer may be formed of the second material or a third material that is different from each of the first material and the second material.

The TFT substrate may include a pixel electrode that overlaps the second insulating layer. The first filling layer may be convex toward the pixel electrode.

The TFT substrate may include a pixel electrode that overlaps the second insulating layer. The TFT substrate may further include an emission layer (e.g., an intermediate layer that includes an organic emission layer) that is connected to the pixel electrode and is configured to emit light. The emission layer may be disposed inside an opening of a pixel defining layer and may have a substantially uniform thickness from an edge of the opening to another edge of the opening. A thickness of a center portion of the emission layer may be substantially equal to a thickness of an edge portion of the emission layer.

The emission layer may overlap the first filling layer.

The emission layer may overlap the electrical wiring structure, which may be a thin-film transistor.

A first side of the first filling layer may directly contact the second insulating layer, and an edge of the first side of the first filling layer may be flush with (i.e., may have the same elevation as) an edge of the second side of the first electrode.

A portion the first filling layer may be disposed between the first insulating layer and a portion of the first electrode.

The TFT substrate may include a second filling layer disposed between the first insulating layer and the second insulating layer. The first filling layer may be formed of a first material. The second filling layer may be formed of the same first material. A maximum thickness of the first filling layer may be unequal to a maximum thickness of the second insulating layer.

The first electrode may be disposed between the first filling layer and the second filling layer.

The source electrode and the drain electrode (of a thin-film transistor) may be disposed between the first filling layer and the second filling layer.

The second filling layer may be disposed between the source electrode and the drain electrode (of a thin-film transistor).

The TFT substrate may include a second electrode. The second insulating layer directly contact a first side of the second insulating layer and a first side of the second electrode, and an edge of the first side of the second filling layer may be flush with (i.e., may have the same elevation as) an edge of the first side of the second electrode.

One or more embodiments of the present invention may be related to a light-emitting apparatus that may include the following elements: an electrical wiring structure that includes a first electrode, the first electrode being a source electrode, a drain electrode, or a capacitor electrode; a first insulating layer that directly contacts a first side of the first electrode; a second insulating layer that directly contacts a second side of the first electrode opposite the first side of the first electrode; a first filling layer that is disposed between the first insulating layer and the second insulating layer; a pixel electrode that overlaps the second insulating layer; and an emission layer (e.g., an intermediate layer that includes an organic emission layer) that is connected to the pixel electrode and is configured to emit light. A thickness of a center portion of the emission layer may be substantially equal to a thickness of an edge portion of the emission layer.

One or more embodiments of the present invention may be related to a method for manufacturing a thin-film transistor (TFT) substrate. The method may include the following steps: forming a first insulating layer; forming an electrical wiring structure that includes a first electrode, the first electrode being a source electrode, a drain electrode, or a capacitor electrode, a first side of the first electrode directly contacting the first insulating layer; forming a first filling layer on the first insulating layer; and forming a second insulating layer, such that the second insulating layer directly contacts a second side of the first electrode opposite the first side of the first electrode, and such that the first filling layer is disposed between the first insulating layer and the second insulating layer.

The first filling layer may be formed of a first material, and wherein the second insulating layer is formed of a second material that is different from the first material.

The first filling layer may be formed using an inkjet printing process.

The method may include the following steps: forming a pixel electrode that overlaps the second insulating layer; and forming an emission layer that is connected to the pixel electrode and is configured to emit light. A thickness of a center portion of the emission layer may be substantially equal to a thickness of an edge portion of the emission layer.

The emission layer may overlap the first filling layer.

The emission layer may overlap the electrical wiring structure, which may be a thin-film transistor.

The emission layer may be formed using a printing process.

A first side of the first filling layer may directly contact the second insulating layer, and an edge of the first side of the first filling layer may be flush with an edge of the second side of the first electrode.

The first electrode may be formed after the first filling layer has been formed. A portion the first filling layer may be disposed between the first insulating layer and a portion of the first electrode.

The method may include forming a second filling layer on the first insulating layer. The second filling layer may be disposed between the first insulating layer and the second insulating layer. The first filling layer may be formed of a first material. The second filling layer may be formed of the same first material. A maximum thickness of the first filling layer may be unequal to a maximum thickness of the second insulating layer.

The first electrode may be disposed between the first filling layer and the second filling layer.

The source electrode and the drain electrode (of a thin-film transistor) may be disposed between the first filling layer and the second filling layer.

The second filling layer may be disposed between the source electrode and the drain electrode (of a thin-film transistor).

One or more embodiments of the present invention may be related to a method for manufacturing a light-emitting apparatus. The method may include the following steps: forming a first insulating layer; forming an electrical wiring structure that includes a first electrode, the first electrode being a source electrode, a drain electrode, or a capacitor electrode, a first side of the first electrode directly contacting the first insulating layer; forming a first filling layer on the first insulating layer; forming a second insulating layer that directly contacts a second side of the first electrode opposite the first side of the first electrode, such that the first filling layer is disposed between the first insulating layer and the second insulating layer; forming a pixel electrode that overlaps the second insulating layer; and forming an emission layer that is connected to the pixel electrode and is configured to emit light. A thickness of a center portion of the emission layer may be substantially equal to a thickness of an edge portion of the emission layer.

The method may include the following steps: forming the first filling layer such that the first insulating layer overlaps a substrate; and removing the substrate.

One or more embodiments of the present invention may be related to a thin-film transistor (TFT) substrate that may include the following elements: a substrate that includes a first region, on which no TFT is disposed, and a second region, on which a TFT is disposed; the TFT disposed on the substrate so as to correspond to the second region; and a filling layer disposed on the substrate so as to fill the first region.

A protective film may be disposed to correspond to the first region and the second region so that the protective film covers the TFT and the filling layer. The filling layer may contact the TFT.

A protective film may be disposed on the substrate so as to correspond to the first region and the second region so that the protective film covers the TFT. The filling layer may be disposed on the protective film.

A top surface of the filling layer may be convex.

A height of the filling layer may correspond to a height of the TFT.

The filling layer may include an organic material.

The filling layer may be formed using an inkjet printing method.

A planarization film may cover the filling layer and the TFT.

The filling layer may include a first filling layer and a second filling layer that have different heights and/or different thicknesses.

The filling layer may include a first filling layer and a second filling layer that are spaced apart from each other.

A pixel electrode may be electrically connected to the TFT.

One or more embodiments of the present invention may be related to an organic light-emitting apparatus that may include the following elements: the TFT substrate described above; an intermediate layer disposed on the pixel electrode and including an emission layer; and an opposite electrode disposed on the intermediate layer.

Light emitted from the emission layer may be emitted through the opposite electrode.

One or more embodiments of the present invention may be related to a method for manufacturing a thin-film transistor (TFT) substrate. The method may include the following steps: preparing a substrate that includes a first region, on which no TFT is to be disposed, and a second region, on which a TFT is to be disposed; forming the TFT on the substrate so as to correspond to the second region; and forming a filling layer on the substrate so as to fill the first region.

The method may include forming a protective film to correspond to the first region and the second region so that the protective film covers the TFT and the filling layer. The filling layer may contact the TFT.

The method may include forming a protective film to correspond to the first region and the second region so that the protective film covers the TFT. The forming of the filling layer may be performed after the forming of the protective layer.

The forming of the filling layer may include forming the filling layer using an inkjet printing method.

A height of the filling layer may correspond to a height of the TFT.

The forming of the filling layer may include forming the filling layer using an organic material.

The method may include forming a planarization film so as to cover the filling layer and TFT.

The method may include the following steps: forming a protective film so as to cover the TFT and the filling layer; and forming a planarization film on the protective film.

The method may include removing the substrate.

The method may include forming a pixel electrode electrically connected to the TFT.

One or more embodiments of the present invention may be related to a method for manufacturing an organic light-emitting apparatus. The method may include the following steps: preparing a thin-film transistor (TFT) substrate that is manufactured using the TFT substrate manufacturing method described above; forming an intermediate layer that includes an emission layer on the pixel electrode; and forming an opposite electrode on the intermediate layer.

The method may include removing the substrate.

The forming of the intermediate layer may include forming the intermediate layer using a liquid process.

DETAILED DESCRIPTION

Figure 1:
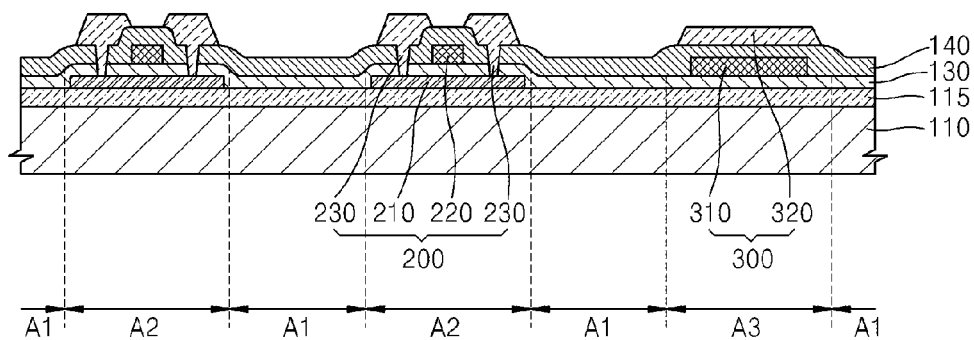
FIGS. 1 through 6 are cross-sectional views illustrating a method for manufacturing an organic light-emitting apparatus, e.g., an organic light-emitting display apparatus, according to an embodiment of the present invention.

Reference will now be made in detail to embodiments, examples of which are illustrated in the accompanying drawings, wherein like reference numerals may refer to like elements. The embodiments may have different forms and should not be construed as being limited to the descriptions set forth herein.

Dimensions (e.g., sizes and/or thicknesses) of elements in the drawings may be exaggerated or reduced for convenience of explanation and may not limit embodiments of the invention.

When an element such as a layer, a film, a region, or a plate is referred to as being "on" another element, it can be directly on the other element or an intervening element can be present.

As used herein, the term "and/or" may include any and all combinations of one or more of the associated items.

Although the terms "first", "second", etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer, or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms "first", "second", etc. may also be used herein to differentiate different categories of elements. For conciseness, the terms "first", "second", etc. may represent "first-type (or first-category)", "second-type (or second-category)", etc., respectively.

FIGS. 1 through 6 are cross-sectional views illustrating a method for manufacturing an organic light-emitting apparatus, e.g., an organic light-emitting display apparatus, according to an embodiment of the present invention.

Referring to FIG. 1, a thin-film transistor (TFT) 200 is formed on a substrate 110. Before the TFT 200 is formed, one or more other layers, such as a buffer layer 115, may be formed on the substrate 110. The buffer layer 115 may be formed on an entire surface of the substrate 110 (as illustrated in FIG. 1) or may be patterned on the substrate 110.

The substrate 110 may be formed of one or more of various materials, such as one or more of glass, metal, and plastic, wherein the plastic may include, for example, polyethylene terephthalate (PET), polyethylene naphthalate (PEN), or polyimide. The substrate 110 includes first-type regions A1 (or first regions A1), in which no TFT 200 (and/or other electrical wiring structure) is to be disposed, and second-type regions A2 (or second regions A2), in which TFTs 200 are to be disposed. As illustrated in FIG. 1, the regions A1 and A2 may be alternately arranged. In one or more embodiments, intervals between region pairs A1-A2, areas of the first regions A1, and/or areas of the second regions A2 may not be constant. In one or more embodiments, the substrate 110 may also include third-type regions A3 (or third regions A3), in which no TFT 200 is disposed but other wiring structures are disposed. Since no TFT 200 is disposed in each third region A3, a third region A3 may be regarded as a portion of a first region A1.

The buffer layer 115 may be formed of one or more of various materials and may have a single-layer or multi-layer structure. In order to manufacture a flexible display apparatus, the buffer layer 115 may be formed using a substantially flexible material, such as polyethylen terephthalate (PET), polyethylene naphthalate (PEN), polyacrylate, or polyimide. The buffer layer 115 may be formed of silicon oxide or silicon nitride. The buffer layer 115 may be formed of a combination of an organic material and an inorganic material.

As shown in FIG. 1, a TFT 200 is formed on the substrate 110 in a second region A2 of the substrate 110. The TFT 200 may form a stepped portion in the structure illustrated in FIG. 1, such that the structure illustrated in FIG. 1 may not have a substantially uniform thickness. A structure that may form a stepped portion in the structure illustrated in FIG. 1 may be formed in the second region A2 in addition to or instead of the TFT 200. A structure that may form a stepped portion in the structure illustrated in FIG. 1 may be formed in a first region A1 of the substrate 110.

A semiconductor layer 210 may be formed in a second region A2, as shown in FIG. 1. The semiconductor layer 210 may include at least one of an amorphous silicon layer, an oxide silicon layer, and a polycrystalline silicon layer. In one or more embodiments, the semiconductor layer 210 may be formed of an organic semiconductor material. Although not shown in FIG. 1, the semiconductor layer 210 may include a source region, a drain region, and a channel region disposed between the source region and the drain region, wherein the source region and the drain region may be doped with dopants.

Subsequently, a gate insulating film 130 may be formed to cover the semiconductor 210. A gate electrode 220 may be formed on the gate insulating film 130. A first capacitor electrode 310 and the gate electrode 220 may be simultaneously formed on the gate insulating film 130.

In one or more embodiments, the gate insulating film 130 may be formed to cover both of the regions A1 and A2 and/or to cover the entire substrate 110. The gate insulating film 130 may be patterned. The gate insulating film 130 may be formed of at least one of silicon oxide, silicon nitride, and an organic/inorganic insulating material. Based on considerations related to an adhesive force with respect to an adjacent layer, a degree of surface planarization of a layer to be stacked, and/or processability, the gate electrode 220 may be formed to have a single-layer structure or a multi-layer structure and may be formed using, for example, at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and an alloy of one or more of the elements.

Subsequently, an interlayer insulating film 140 may be formed to cover the gate electrode 220 and the gate insulating film 130. The interlayer insulating film 140 may be formed using silicon oxide, silicon nitride, and/or an organic/inorganic insulating material. Contact holes may be formed by removing portions of the gate insulating film 130 and the interlayer insulating film 140 to expose predetermined portions (e.g., the source region and/or the drain region) of the semiconductor layer 210. The interlayer insulating film 140 may be partially patterned if necessary. Source/drain electrodes 230 that contact the semiconductor layer 210 through contact holes may be formed. Each source/drain electrode 230 may be a source electrode or a drain electrode. A TFT 200 may include a semiconductor layer 210, a gate electrode 220, and two source/drain electrodes 230 (i.e., a source electrode and a drain electrode). A second capacitor electrode 320 and the source/drain electrodes 230 may be simultaneously formed on the interlayer insulating film 140. As a result, a capacitor 300 that the first capacitor electrode 310 and the second capacitor electrode 320 may be formed on the substrate 110. Based on considerations related to conductivity, the source/drain electrodes 230 may be formed to have a single-layer structure or a multi-layer structure and may be formed using, for example, at least one of Al, Pt, Pd, Ag, Mg, Au, Ni, Nd, Ir, Cr, Li, Ca, Mo, Ti, W, Cu, and an alloy of one or more of the elements.

Figure 2:
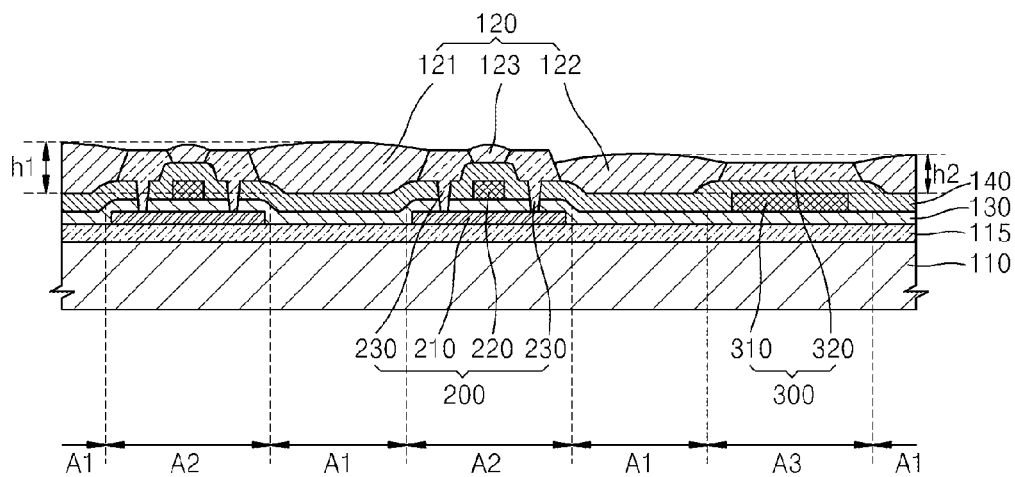

Referring to FIG. 2, after TFTs 200 are formed to correspond to second regions A2, a filling layer 120 is formed on the substrate 110 so as to fill spaces between source/drain electrodes 230 and second capacitor electrodes 320. The filling layer 120 may overlap the first regions A1 of the substrate 110, as shown in FIG. 2. For minimizing thickness variation in the structure illustrated in FIG. 2, a sum of a thickness h1 of the filling layer 120, a thickness of the interlayer insulating film 140, and a thickness of the gate insulating film 130 may approximate or equal a total thickness of the TFT 200. Accordingly, a height of the filling layer 120 (measured from a bottom surface of the substrate 110) may approximate or equal a height of the TFT 200 (measured from the bottom surface of the substrate 110). The filling layer 120 may not only overlap the first regions A1, but may also exist in portions of the second regions A2 (e.g., between a source electrode and a drain electrode and overlapping a gate electrode 220). The filling layer 120 may directly contact the TFTs 200, as shown in FIG. 2.

The filling layer 120 may be formed of an organic material and may be formed using an inkjet printing method. An organic material used for forming the filling layer 120 may have low flowability so as to stay in a printed region. That is, the organic material for forming the filling layer 120 may have a high viscosity and/or a high concentration in solid components so as not to flow out of the printed region. The organic material may be an organic polymer, such as polyacrylate or polyimide. Before the filling layer 120 is formed, a portion of the structure illustrated in FIG. 1 where the filling layer 120 is to be formed may be plasma-processed, and thus the organic material for forming the filing layer 120 may not flow into other regions when the organic material is printed. As a result of the method discussed above, a top surface of the filling layer 120 may have a curved shape and/or may be convex.

As shown in FIG. 2, the filling layer 120 may include a first filing layer 121 and a second filling layer 122 separated from the first filling layer 121 by the TFT 200. The filling layer 120 may further include a third filling layer 123 spaced apart from the first filling layer 121 and/or the second filling layer 122. The third filling layer 123 may be disposed in the second region A2, in which the TFT 200 is disposed. The third filling layer 123 may be disposed between the source electrode and the drain electrode of the TFT 200 and may overlap the gate electrode 220 in a direction perpendicular to a bottom surface of the substrate 110. The third filling layer 123 may be disposed in a portion of the TFT 200 in which a stepped portion may exist. In the cross-sectional view illustrated in FIG. 2, the filling layers 121 and 122 are illustrated as being spaced apart. A portion of the first filling layer 121 that is not illustrated in FIG. 2 may be connected to a portion of the second filling layer 122 that is not illustrated in FIG. 2.

The filling layer 120 may not have a constant (or uniform) thickness or height. As shown in FIG. 2, the (maximum) thickness or height h1 of the first filling layer 121 (measured from a top surface of the interlayer insulating film 140) may not be equal to a (maximum) thickness or height h2 of the second filling layer 122 (measured from a top surface of the interlayer insulating film 140). In order for the filling layer 120 to have various heights, the filling layer 120 may have a multi-layer structure. For example, the filling layer 120 may have two layers in a region between the TFTs, and the filling layer 120 may have one layer in a region between the TFT 200 and the capacitor 300.

Figure 3:
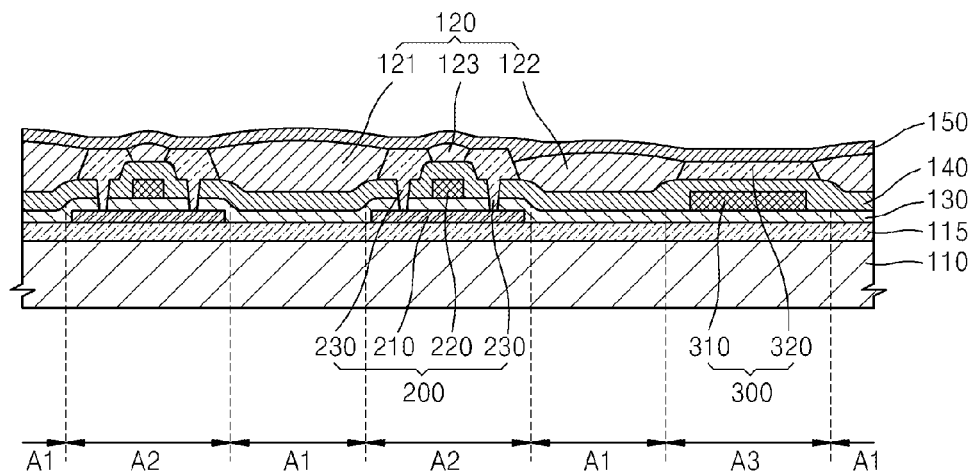

The filling layer 120 may be formed on the substrate 110 so as to correspond to at least a portion of the first regions A1, which may correspond to an inactive area of an organic light-emitting display apparatus where no TFT 200 is disposed. The filling layer 120 may include portions, e.g., the third filling layer 123, disposed in the second regions A2, which may correspond to an active area of the organic light-emitting display apparatus, wherein TFTs 200 are disposed. Referring to FIG. 3, after the filling layer 120 is formed, a protective film 150 is formed to cover the source/drain electrodes 230 of the TFT 200 and the filling layer 120. The protective film 150 may be formed using silicon oxide, silicon nitride, and/or an organic/inorganic insulating material. The filling layer 120 may directly contact a side surface of a source/drain electrode 230. The protective film 150 may be formed of a material different from a material of the filling layer 120 and may directly contact a top surface of the source/drain electrode 230 that is not parallel to the side surface of the source/drain electrode 230.

The protective film 150 may completely or partially cover a top surface of the substrate 110 and/or the structure illustrated in FIG. 2. As shown in FIG. 3, since the TFT 200 having a multi-layer structure is disposed under the protective film 150, a top surface of the protective film 150 may not be completely flat or completely level. Since the filling layer 120 has been formed in spaces between source/drain electrodes 230 and second capacitor electrodes 320, even if the top surface of the protective film 150 is not completely flat, elevation differences between regions of the top surface of the protective film 150 may not be very large. Accordingly, when a planarization film 160 is formed on the protective film 150, as shown in FIG. 4, a top surface of the planarization film 160 may be sufficiently flat.

Embodiments of the present embodiment are not limited to minimizing steps related to only the TFT 200 or the capacitor 300. The planarization film 160 may be formed such that the top surface of the planarization film 160 is sufficiently flat by adjusting the height of the filling layer 120 or not forming the filling layer 120 in a region where a wiring structure other than a TFT or capacitor is disposed. Structures related to the TFT 200 are discussed as examples.

The planarization film 160 may be formed of a material that includes at least one of an acryl-based material, polyimide, and benzocyclobutene (BCB). The planarization film 160 may be formed of at least one of silicon oxide, silicon nitride, etc. The top surface of the planarization film 160 may be planarized using a mechanical method such as milling. The protective film 150 may be omitted, and the planarization film 160 may be formed to contact and cover the filling layer 120 and the TFT 200. The filling layer 120 may directly contact a side surface of a source/drain electrode 230. The planarization film 160 may be formed of a material different from a material of the filling layer 120 and may directly contact a top surface of the source/drain electrode 230 that is not parallel to the side surface of the source/drain electrode 230.

Figure 4:
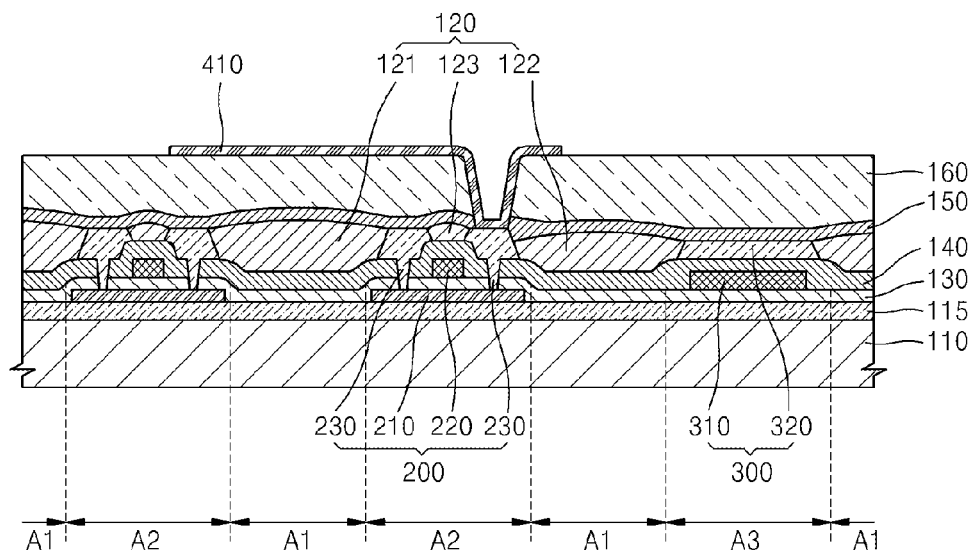

After the planarization film 160 is formed, as shown in FIG. 4, a via hole is formed in the protective film 150 and the planarization film 160 so as to expose at least one of the source/drain electrodes 230 of the TFT 200. Subsequently, a pixel electrode 410 is formed on the planarization film 160 to be electrically connected to the TFT 200 through the via hole. Afterward, referring to FIG. 5, a pixel defining film 170, which may have a single-layer structure or a multi-layer structure, may be formed on the planarization film 160 and at least a portion of the pixel electrode 410. The pixel defining film 170 may be formed using an organic material, such as polyacrylate or polyimide, or an inorganic material. The pixel defining film 170 may expose a portion of the pixel electrode 410, such as a central portion of the pixel electrode 410.

The pixel electrode 410 may be a transparent electrode, a semi-transparent electrode, or a reflective electrode. The pixel electrode 410 may be a transparent electrode or a semi-transparent electrode and may be formed of a material that includes one or more of, for example, indium tin oxide (ITO), indium zinc oxide (IZO), zinc oxide (ZnO), indium oxide ($In_2O_3$), indium gallium oxide (IGO), and aluminum zinc oxide (AZO). The pixel electrode 410 may be a reflective electrode and may include a reflective film formed of a material that includes at least one of Ag, Mg, Al, Pt, Pd, Au, Ni, Nd, Ir, Cr, and a compound of one or more of the elements; the pixel electrode 410 may further include a film formed of a material that includes at least one of ITO, IZO, ZnO, and $In_2O_3$. The pixel electrode 410 may have one or more of other structures and/or other materials.

The pixel defining film 170 may define a pixel by having an opening corresponding to the pixel, wherein the opening may expose at least a central portion of the pixel electrode 410 associated with the pixel. The pixel defining film 170 may prevent electric arcs from occurring at an end portion of the pixel electrode 410 by increasing a distance between the end portion of the pixel electrode 410 and an opposite electrode 430 (see FIG. 7) that is overlaps the pixel electrode 410.

Figure 6:
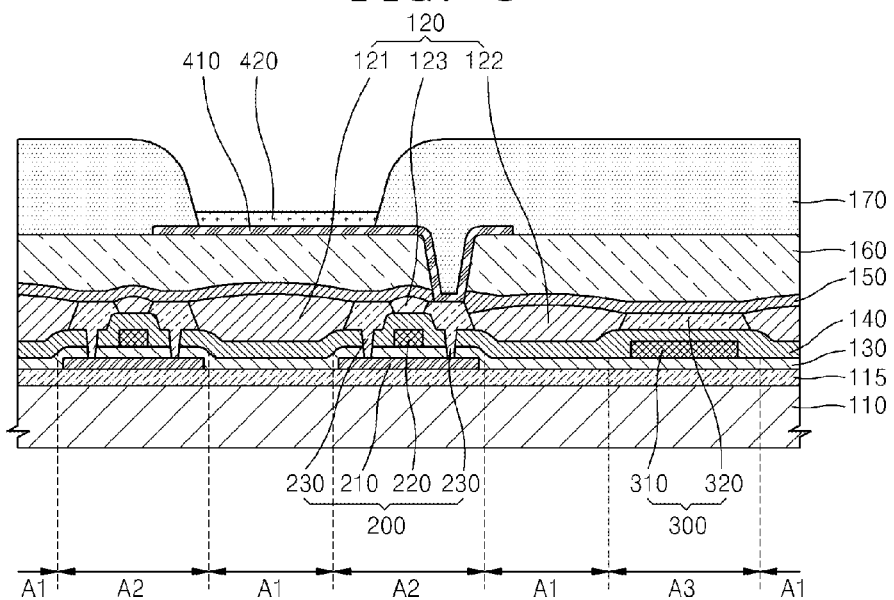

Referring to FIG. 6, an intermediate layer 420 that includes an emission layer (EML) for emitting light is formed in the opening of the pixel defining film 170. The intermediate layer 420 may directly contact the pixel electrode 410.

Figure 7:
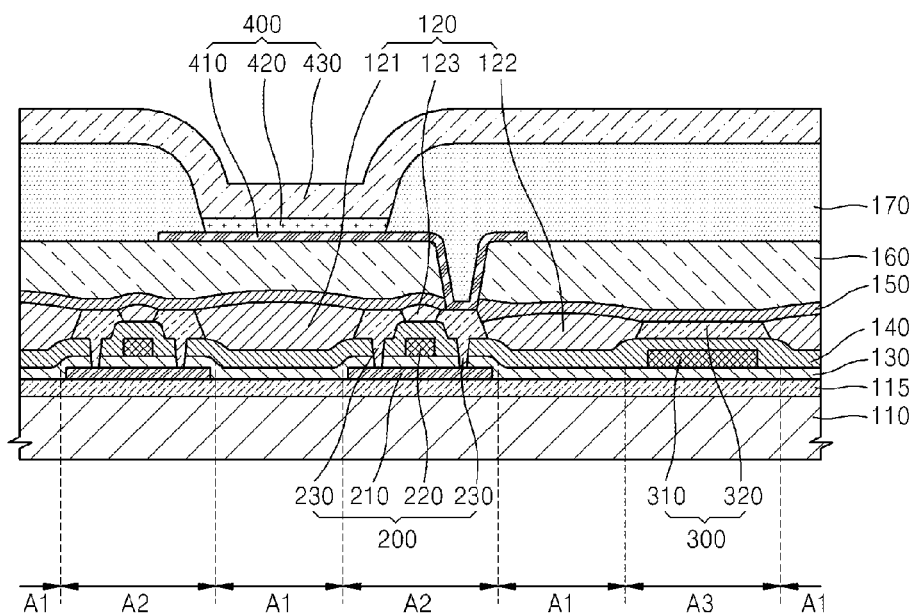
FIG. 7 is a cross-sectional view illustrating an organic light-emitting apparatus, e.g., an organic light-emitting display apparatus, according to an embodiment of the present invention.

Referring to FIG. 7, the opposite electrode 430 is formed on the pixel defining film 170 and the intermediate layer 420. The opposite electrode 430 may overlap at least the pixel electrode 410 and/or most portions of the substrate 110. As a result, referring to FIG. 7, an organic light-emitting apparatus, e.g., an organic light-emitting display apparatus, may be formed. The organic light-emitting apparatus may include an organic light-emitting diode 400 that is electrically connected to the TFT 200. The organic light-emitting diode 400 may include the pixel electrode 410, the intermediate layer 420, and a portion of the opposite electrode 430.

The opposite electrode 430 may be associated with a plurality of pixels and may cover a display region (active region) of the organic light-emitting display device. The term 'display region' may refer to a region of the organic light-emitting display apparatus where light may be emitted. For example, the display region may be a region other than an edge of the organic light-emitting display apparatus, wherein a controller may be disposed at the edge of the organic light-emitting display apparatus. An entire surface of the organic light-emitting display apparatus may be configured to emit light, and the entire surface of the organic light-emitting display apparatus may be a display region.

The opposite electrode 430 may receive an electrical signal from an electrode power supply line that is disposed outside the display region. The opposite electrode 430 may be a transparent electrode, a semi-transparent electrode, or a reflective electrode. The opposite electrode 430 may be a transparent electrode or a transparent electrode and may include a film formed of a material that includes at least one of indium tin oxide (ITO), indium zinc oxide (IZO), zinc oxide (ZnO), indium oxide ($In_2O_3$), indium gallium oxide (IGO), aluminum zinc oxide (AZO), Li, Ca, LiF/Ca, LiF/Al, Al, Mg, and a compound of one or more the elements. The opposite electrode 430 may be disposed, using deposition, on the intermediate layer 420. The opposite electrode 430 may be disposed adjacent to an auxiliary electrode or a bus electrode line formed of a transparent or semi-transparent material, such as ITO, IZO, ZnO, or $In_2O_3$. The opposite electrode 430 may be a reflective electrode and may include a layer formed of a material that includes at least one of, for example, Li, Ca, LiF/Ca, LiF/Al, Al, Ag, and Mg. The opposite electrode 430 may have one or more of other structures and/or other materials.

In the organic light-emitting display apparatus manufactured as described above, the TFT 200 is formed in a region that corresponds to the second region A2, and the filling layer 120 fills the first region A1, such that the thickness variation of the structure illustrated in FIG. 2 or FIG. 3 is not significantly large. Therefore, referring to FIG. 4, the planarization film 160 may be formed to have a considerably flat top surface. Accordingly, referring to FIG. 5, the pixel electrode 410, which is formed on the planarization film 160, may be substantially flat. Advantageously, referring to FIG. 6, a thickness of the intermediate layer 420 may be substantially uniform.

Figure 8:
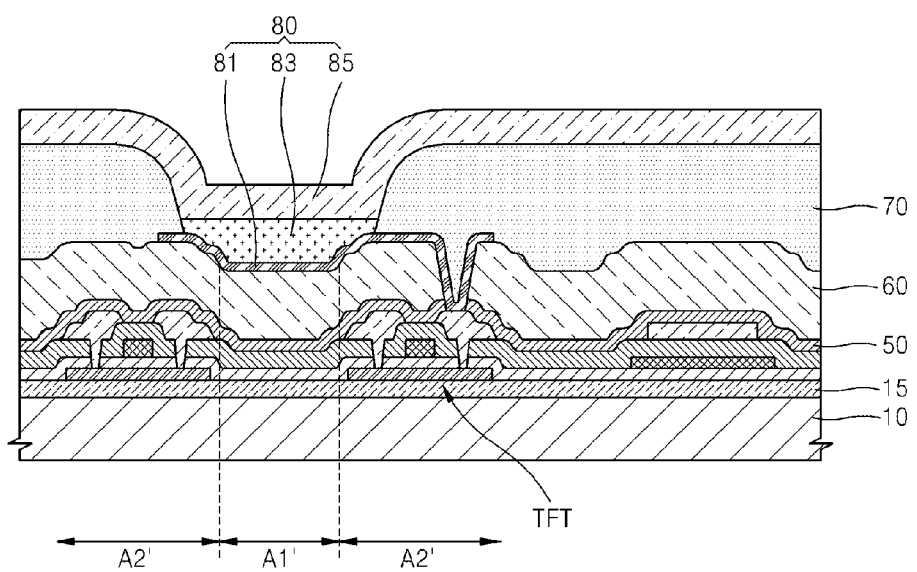
FIG. 8 is a cross-sectional view illustrating an organic light-emitting apparatus, e.g., an organic light-emitting display apparatus, according to a comparative example.

FIG. 8 is a cross-sectional view illustrating an organic light-emitting apparatus, e.g., an organic light-emitting display apparatus, according to a comparative example. The organic light-emitting display apparatus does not include a filling layer. In the organic light-emitting display apparatus, a TFT is formed on a buffer layer 15 (which is disposed on a substrate 10), a protective film 50 and a planarization film 60 are formed to cover the TFT, a pixel electrode 81 is formed on the planarization film 60, a pixel defining film 70 is formed on the planarization film 60, an intermediate layer 83 that includes an emission layer (EML) is formed on the pixel electrode 81, and an opposite electrode 85 is formed on the intermediate layer 83 and the pixel defining film 70. The TFT and an organic light-emitting diode 80 are electrically connected to each other.

Since the organic light-emitting display apparatus does not include a filling layer, there is a large elevation difference between a top surface of the protective film 50 in a first region A1', in which the TFT is not formed, and a top surface of the protective film 50 in second region A2', in which the TFT is formed. Accordingly, when the planarization film 60 is formed on the protective film 50, a top surface of the planarization film 60 may also have a considerable elevation difference although elevation differences between regions of the top surface of the planarization film 60 may be less than elevation differences between regions of the top surface of the protective film 50.

As a result, in the organic light-emitting display apparatus according to the comparative example, the pixel electrode 81 is formed on the uneven top surface of the planarization film 60. Accordingly, when the intermediate layer 83 is formed using a liquid process, such as inkjet printing or nozzle printing, on the pixel electrode 81, since a material for forming the intermediate layer 83 is liquid, the intermediate layer 83 may have a flat top surface irrespective of the unevenness of the pixel electrode 81 disposed under the intermediate layer 83. As a result, the intermediate layer 83 may have a substantially non-uniform thickness. As is apparent from FIG. 8, a thickness of the intermediate layer 83 in a second region A2' is greater than a thickness of the intermediate layer 83 in a first region A1'.

The substantial non-uniformity of the thicknesses of the intermediate layer 83 may cause substantial non-uniformity in the amount of light emitted. In a region where the intermediate layer 83 is thin, electrons and holes may be smoothly injected, and thus an associated luminance may be relatively high. In a region where the intermediate layer 83 is thick, electrons and holes may not be smoothly injected, and an associated luminance may be relatively low. As a result, the luminance of light emitted from a pixel may be substantially non-uniform.

In contrast, referring to FIGS. 1 to 7, in an organic light-emitting display apparatus according to one or more embodiments of the present invention, since the filing layer 120 is formed in spaces between source/drain electrodes 230 and second capacitor electrodes 320, unevenness of the top surface of the protective film 150 may be minimized, unevenness of the top surface of the planarization film 160 may be minimized, and unevenness of the top surface of the pixel electrode 410 may be minimized. As a result, the intermediate layer 420 (which may be formed using one or more liquid processes) may have a substantially uniform thickness. Advantageously, luminance uniformity of light emitted from a pixel may be optimized, the image display quality of the organic light-emitting display apparatus may be satisfactory, and associated manufacturing yields may be maximized according to embodiments of the invention.

Not all layers of the entire intermediate layer 420 have to be formed using a liquid process. One or more layers of the intermediate layer 420 may be formed using deposition. One or more layers of the intermediate layer 420 may be formed using a liquid process.

The intermediate layer 420 may be formed using a liquid material, and the intermediate layer 420 may include all or some of a hole injection layer (HIL), a hole transport layer (HTL), an interfacial control layer (e.g., an interlayer or a primer layer), and an EML. The liquid material may include, for example, a polymer, a low molecular weight material, and/or a dendrimer.

The HTL may be formed of poly-(3,4)-ethylene-dihydroxy thiophene (PEDOT), polyaniline (PANI), doped or undoped polythiophene, or a p-doped material. The EML may be formed of a polymer, a high molecular weight material, a low molecular weight material (such as a soluble low molecular weight material), or a dendrimer (which may be a liquid fluorescent or phosphorescent material). Examples of the high molecular weight material may include a poly-phenylenevinylene (PPV)-based material and a polyfluorene-based material. The low molecular weight material may be a typical low molecular weight material and/or a material which liquefied by adding a functional group for liquefaction to a specially devised material.

The intermediate layer 420 may be formed using a liquid material in a liquid process, wherein the liquid material may be applied to the pixel electrode 410 through the opening. A portion of the pixel defining film 170 that is configured to contact the liquid material, that is, a portion of the pixel defining film 170 adjacent to the pixel electrode 410, may be formed of a material that has a relatively high surface energy and thus high wettability, such as silicon nitride or silicon oxide; other portions of the pixel defining film 170 may be formed of an organic material. That is, a portion of the pixel defining film 170 immediately adjacent to the opening may be formed of a first material that is different from a second material used for forming other portions of the pixel defining film 170. A surface energy of the first material may be higher than a surface energy of the second material. Since the surface energy of the first material is high, the liquid material may concentrate at the pixel electrode 410 instead of being distributed on a top surface of the pixel defining film 170 during the liquid process.

The surface energy of a certain portion of the pixel defining film 170 may be temporarily or permanently changed by treating the portion of the pixel defining film 170 using a light having a specific wavelength or using plasma.

The organic light-emitting display apparatus may be a bottom emission organic light-emitting display apparatus, in which light is emitted from the EML through the pixel electrode 410 and the substrate 110 to a viewer of the display apparatus. For minimizing obstruction of the light, the TFT 200 or a wiring structure may not overlap the pixel electrode 410 in a direction perpendicular to the bottom surface of the substrate 110. The filling layer 120 may help optimizing surface evenness of the protective film 150, the planarization film 160, and/or the pixel electrode 410. The organic light-emitting display apparatus may be a top emission organic light-emitting display apparatus, in which light is emitted from the EML to a viewer of the apparatus through the opposite electrode 430. The TFT 200 or a different wiring structure that contributes to structure surface unevenness may be disposed under the pixel electrode 410 without obstructing transmission of the light. The filling layer 120 may help optimizing surface evenness of the protective film 150, the planarization film 160, and/or the pixel electrode 410 and optimizing thickness uniformity of the intermediate layer 420, thereby advantageously optimizing luminance uniformity of the emitted light.

In order to reduce an elevation difference between the regions of the top surface of the protective film 150 disposed under the planarization film 160, the height of the filing layer 120 measured from the bottom surface of the substrate 110 may be formed to be approximate or equal to the height of the TFT 200 measured from the bottom surface of the substrate 110. Referring to FIG. 2, the "top surface" of the structure illustrated in FIG. 2 may include a top surface of the filling layer 120 and a top surface of the TFT 200.

For the height of the filing layer 120 to be approximate or equal to the height of the TFT 200, a sum of a thickness h1 of the filling layer 120, a thickness of the interlayer insulating film 140, and a thickness of the gate insulating film 130 may approximate or equal a total thickness of the TFT 200 (which is, for example, a distance between a bottom surface of the semiconductor layer 210 and a top surface of the source/drain electrodes 230).

A top surface of the protective film 150 that covers the filling layer 120 and the TFT 200 may be substantially flat, and the planarization film 160 may be omitted. Even if at least one layer of the intermediate layer 420 is formed using a liquid process, the layer may have a substantially uniform thickness.

Figure 9:
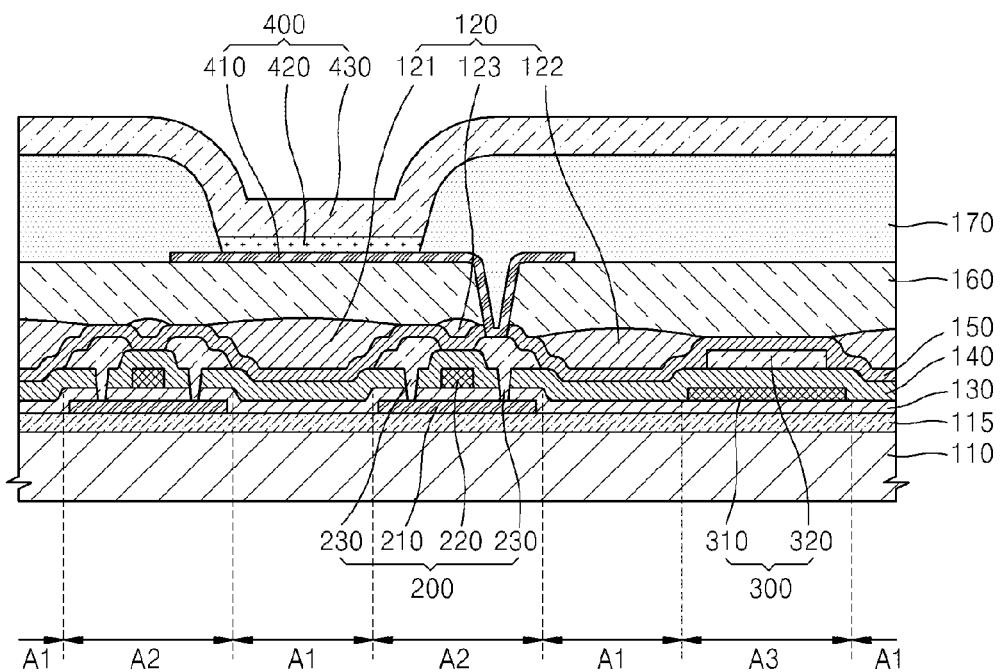
FIG. 9 is a cross-sectional view illustrating an organic light-emitting apparatus, e.g., an organic light-emitting display apparatus, according to an embodiment of the present invention.

FIG. 9 is a cross-sectional view illustrating an organic light-emitting apparatus, e.g., an organic light-emitting display apparatus, according to an embodiment of the present invention. A method for manufacturing the organic light-emitting apparatus may include the following steps: forming a TFT 200 on a substrate 110 in a second region A2; forming a protective film 150 that completely or partially covers a top surface of the substrate 110, so as to cover the TFT 200; and forming the filling layer 120 on the protective film 150 to fill at least a space in a first region A1. A planarization film 160 may be formed to contact and cover the filling layer 120. The planarization film 160 may contact at least a portion of the protective film 150 that is not covered by the filling layer 120.

Although the top surface of the filling layer 120 may not be completely flush (or even) with the top surface of the protective film 150 not covered by the filling layer 120, elevation differences between the top surface may not be significantly large. Therefore, the top surface of the planarization film 160 may be sufficiently flat, so that a pixel electrode 410 disposed on the planarization film 160 may be sufficiently flat. Accordingly, even if an intermediate layer 420 (including an EML) is formed on the pixel electrode 410 using a liquid process, the intermediate layer 420 may have a uniform thickness. Accordingly, luminance of light emitted from the pixel may be substantially uniform. Advantageously, the image display quality of the organic light-emitting display apparatus may be satisfactory, and manufacturing yields associated with the manufacturing method may be satisfactory. Not all layers of the intermediate layer 420 have to be formed using a liquid process. One or more layers of the intermediate layer 420 may be formed using deposition, and one or more other layers may be formed using a liquid process.

Figure 10:
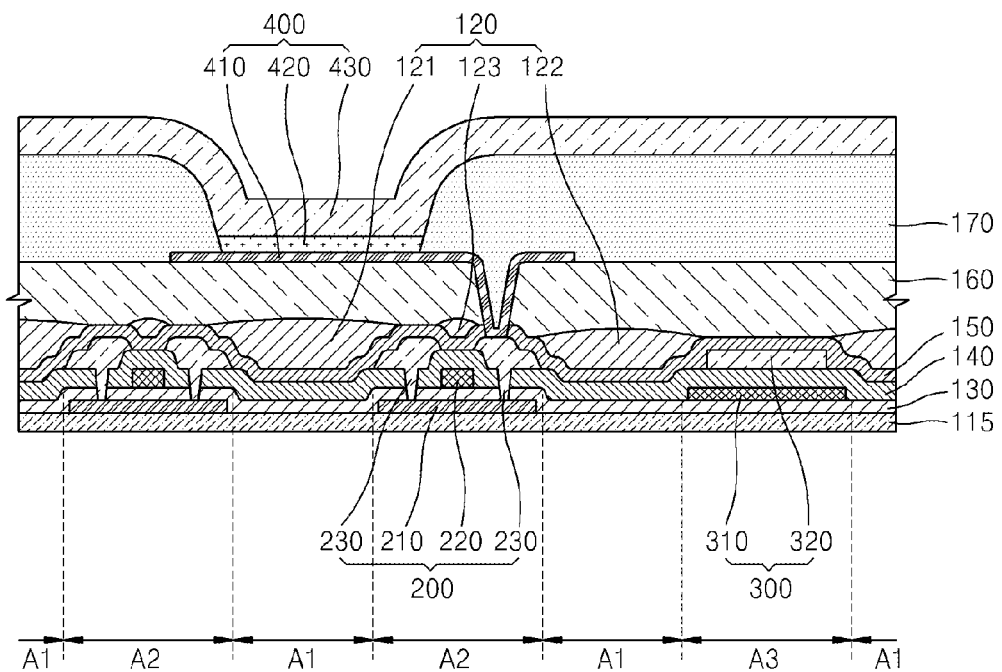
FIG. 10 is a cross-sectional view illustrating an organic light-emitting apparatus, e.g., an organic light-emitting display apparatus, according to an embodiment of the present invention.

FIG. 10 is a cross-sectional view illustrating an organic light-emitting apparatus, e.g., an organic light-emitting display apparatus, according to an embodiment of the present invention. Referring to FIG. 9 and FIG. 10, a method for manufacturing the organic light-emitting apparatus may include a process of removing the substrate 110 shown in FIG. 9. The buffer layer 115 may function as a substrate of the organic light-emitting apparatus. In manufacturing of the organic light-emitting display apparatus, various layers may be formed and/or patterned in various chambers. Since handling stability is very important during transition between chambers, and since one or more of the layers may be flexible or fragile during the manufacturing, the substrate 110 may need to be sufficiently thick, in order to provide robust support. For minimizing the thickness of the organic light-emitting display apparatus or for maximizing the flexibility of the organic light-emitting display apparatus, the substrate 110 may be removed after some process steps or at the end of the manufacturing process.

The filling layer 120 may be patterned to include separated island-shaped portions, such as filling layers 121 and 122. Advantageously, substantial flexibility of the organic light-emitting display apparatus may be implemented.

Figure 5:
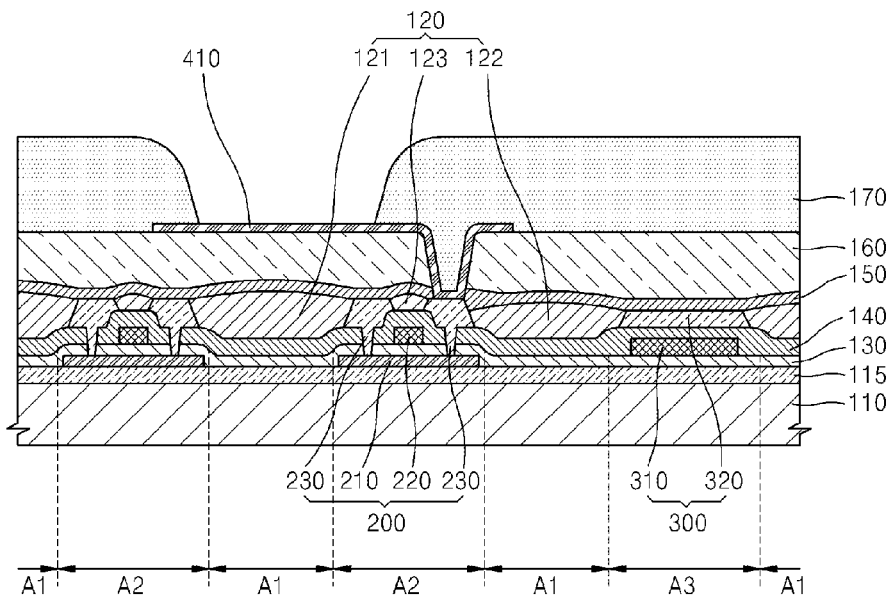

The substrate 110 may be removed after a certain process step and/or before a certain process step. Referring to FIG. 3 and FIG. 4, after the protective film 150 that covers the TFT 200 is formed, the substrate 110 may be removed, and subsequently the planarization film 160 may be formed. Referring to FIG. 4 and FIG. 5, after the pixel electrode 410 is formed, the substrate 110 may be removed, and then the pixel defining film 170 may be formed. Referring to FIG. 5, after the pixel defining film 170 is formed, the substrate 110 may be removed. Referring to FIG. 2 and FIG. 3, before or after the protective film 150 is formed, the substrate 110 may be removed.

Figure 11:
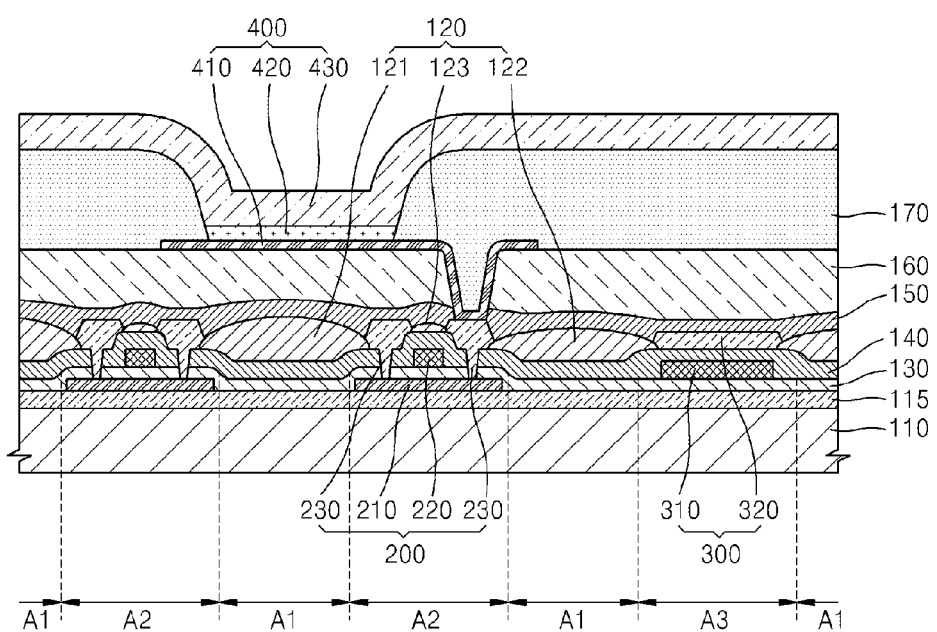
FIG. 11 is a cross-sectional view illustrating an organic light-emitting apparatus, e.g., an organic light-emitting display apparatus, according to an embodiment of the present invention.

FIG. 11 is a cross-sectional view illustrating an organic light-emitting apparatus, e.g., an organic light-emitting display apparatus, according to an embodiment of the present invention. In a method for manufacturing the organic light-emitting display apparatus, a manufacturing process of a TFT 200 may be combined with a manufacturing process of a filling layer 120. Referring to FIG. 11, in a structure where a interlayer insulating film 140 is formed but source/drain electrodes 230 are not formed, the filling layer 120 may be formed on the interlayer insulating film 140 so as to correspond to the first region A1, and then the source/drain electrodes 230 may be formed. Afterward, the protective film 150 may be formed to cover the TFT 200 and the filling layer 120. Accordingly, elevation differences between regions of the top surface of the protective film 150 may not be significantly large. Thus, the top surface of the planarization film 160 may be substantially flat.

Since the source/drain electrodes 230 and/or the second capacitor electrode 320 is formed after the filling layer 120 is formed, a portion of the filling layer 120 may be disposed between a source/drain electrodes 230 and the interlayer insulating film 140 or between the second capacitor electrode 320 and the interlayer insulating film 140.

Embodiments of the invention may be related to a TFT substrate and a method for manufacturing the TFT substrate.

The TFT substrate may include a structure illustrated in one or more of FIGS. 1 to 11. Referring to FIG. 3, the TFT substrate may include a structure wherein the TFT 200, the filling layer 120, and the protective film 150 that covers the TFT 200 and the filling layer 120 are formed on the substrate 110. Referring to FIG. 4, the TFT substrate may include a structure wherein the TFT 200, the filling layer 120, the protective film 150, and the planarization film 160 are formed on the substrate 110. Referring to FIG. 4, the TFT substrate may include a structure wherein the TFT 200, the filling layer 120, the protective film 150, the planarization film 160, and the pixel electrode 410 are formed on the substrate 110. Referring to FIG. 11, the TFT substrate may include a structure wherein the TFT 200 and the filling layer 120 are formed on the substrate 110; a structure wherein the TFT 200, the filling layer 120, and the protective layer 150 are formed on the substrate 110; a structure wherein the TFT 200, the filling layer 120, the protective layer 150, and the planarization film 160 are formed on the substrate 110; or a structure wherein the TFT 200, the filling layer 120, the protective layer 150, the planarization film 160, and the pixel electrode 410 are formed on the substrate 110. The TFT substrate may not include the substrate 110.

The method for manufacturing the TFT substrate may include one or more steps related to one or more structures illustrated in FIGS. 1 to 11.

As described above, embodiments of the present invention may enable an intermediate layer that includes an emission layer (EML) to have a substantially uniform thickness. Advantageously, a TFT substrate or a light-emitting apparatus that includes the intermediate layer may provide light that has substantially uniform luminance, and/or a display apparatus that includes the intermediate layer may provide satisfactory image quality.

The embodiments described above should be considered to be illustrative and not limiting. Descriptions of features or aspects in each embodiment may be available for other embodiments.

While embodiments of the present invention have been described with reference to the figures, it will be understood by those of ordinary skill in the art that various changes in form and details may be made without departing from the spirit and scope of the present invention as defined by the following claims.

What is claimed is:

1. A thin film transistor (TFT) substrate comprising:
a substrate comprising a first region, on which no TFT is disposed, and a second region;
a TFT disposed on the second region of the substrate, the TFT including a semiconductor layer, a gate electrode, a source electrode electrically connected to the semiconductor layer through a first contact hole in an insulating layer covering the gate electrode, and a drain electrode electrically connected to the semiconductor layer through a second contact hole in the insulating layer, a remaining part of the source electrode outside the first contact hole and a remaining part of the drain electrode outside the second contact hole directly contacting an upper surface of the insulating layer; and
a filling layer directly contacting at least one of a side surface of the source electrode and a side surface of the drain electrode, the side surface of the source electrode and the side surface of the drain electrode being above the insulating layer, wherein the filling layer does not cover either of a top surface of the source electrode and a top surface of the drain electrode, and wherein the filling layer does not directly contact the gate electrode, wherein a maximum height of the filling layer from a top surface of the substrate on the first region of the substrate is less than a maximum height of the filling layer from the top surface of the substrate on the second region of the substrate.

2. A thin film transistor (TFT) substrate comprising:
a substrate comprising a first region, on which no TFT is disposed, and a second region;
a TFT disposed on the second region of the substrate, the TFT including a gate electrode, a source electrode, and a drain electrode;
a protective film disposed on the first and second regions of the substrate so that the protective film covers the TFT, wherein the protective film directly contacts at least one of a top surface of the source electrode and a top surface of the drain electrode, and wherein the protective film does not directly contact the gate electrode; and
a filling layer disposed on the protective film, wherein the filling layer does not cover a portion of a top surface of the protective film corresponding to both of the top surface of the source electrode and the top surface of the drain electrode,
wherein a maximum height of the filling layer from a top surface of the substrate on the first region of the substrate is less than a maximum height of the filling layer from the top surface of the substrate on the second region of the substrate.

3. The TFT substrate of claim 1, further comprising a protective film disposed to correspond to the first and second regions of the substrate so that the protective film covers the TFT and the filling layer.

4. The TFT substrate of claim 3, wherein the filling layer completely covers the side surface of the source electrode of the TFT and completely covers the side surface of the drain electrode of the TFT.

5. The TFT substrate of claim 1, wherein a top surface of the filling layer is convex.

6. The TFT substrate of claim 1, wherein a height of the filling layer corresponds to a height of the TFT so that a top surface of the filling layer is flush with a top surface of the TFT.

7. The TFT substrate of claim 1, wherein the filling layer comprises an organic material.

8. The TFT substrate of claim 1, further comprising a planarization film that is disposed to cover the filling layer and the TFT.

9. The TFT substrate of claim 1, wherein the filling layer comprises a first filling layer and a second filling layer that have different heights.

10. The TFT substrate of claim 1, wherein the filling layer comprises a first filling layer and a second filling layer that are spaced apart from each other.

11. The TFT substrate of claim 1, further comprising a pixel electrode that is electrically connected to the TFT.

12. An organic light-emitting apparatus comprising:
the thin film transistor (TFT) substrate of claim 11;
an intermediate layer disposed on the pixel electrode and comprising an emission layer; and
an opposite electrode disposed on the intermediate layer.

13. The organic light-emitting apparatus of claim 12, wherein light from the emission layer is externally emitted through the opposite electrode.

* * * * *